United States Patent
Nishizawa

(10) Patent No.: US 9,412,829 B2
(45) Date of Patent: Aug. 9, 2016

(54) METHOD FOR FABRICATING SEMICONDUCTOR DEVICE AND SEMICONDUCTOR DEVICE

(71) Applicant: SUMITOMO ELECTRIC DEVICE INNOVATIONS, INC., Yokohama-shi, Kanagawa (JP)

(72) Inventor: Shuichi Nishizawa, Yokohama (JP)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 0 days.

(21) Appl. No.: 13/930,904

(22) Filed: Jun. 28, 2013

(65) Prior Publication Data

US 2014/0001640 A1 Jan. 2, 2014

(30) Foreign Application Priority Data

Jun. 29, 2012 (JP) .................. 2012-147538

(51) Int. Cl.
*H01L 21/00* (2006.01)
*H01L 29/51* (2006.01)
*H01L 29/417* (2006.01)
*H01L 29/47* (2006.01)
(Continued)

(52) U.S. Cl.
CPC .......... *H01L 29/511* (2013.01); *H01L 29/2003* (2013.01); *H01L 29/402* (2013.01); *H01L 29/417* (2013.01); *H01L 29/475* (2013.01); *H01L 29/66462* (2013.01); *H01L 29/7787* (2013.01); *H01L 21/28587* (2013.01); *H01L 29/401* (2013.01); *H01L 29/42316* (2013.01); *H01L 29/812* (2013.01)

(58) Field of Classification Search
CPC ..................................... H01L 29/401
USPC ........................................... 257/773
See application file for complete search history.

(56) References Cited

U.S. PATENT DOCUMENTS

| | | | |
|---|---|---|---|
| 5,014,018 A * | 5/1991 | Rodwell et al. | ........ 333/20 |
| 2003/0173584 A1* | 9/2003 | Nikaido | ........ 257/194 |

(Continued)

FOREIGN PATENT DOCUMENTS

| | | |
|---|---|---|
| JP | 07-183312 A | 7/1995 |
| JP | 2003-179057 A | 6/2003 |

(Continued)

OTHER PUBLICATIONS

N. Miura, et al., "Thermal Annealing Effects on Ni/Au Based Schottky contacts on n-GaN and AlGaN/GaN With Insertion of High Work Function Metal", Solid-State Electronics, Elsevier, Feb. 19, 2004, vol. 48, Issue 5, pp. 689-695, with English translation.

(Continued)

*Primary Examiner* — William Harriston
(74) *Attorney, Agent, or Firm* — Westerman, Hattori, Daniels & Adrian, LLP

(57) ABSTRACT

A method for fabricating a semiconductor device includes: forming a metal pattern including nickel on a semiconductor layer, the metal pattern having upper and side surfaces; forming a mask pattern having an opening in which upper and side surfaces of the metal pattern therein being exposed; forming a barrier layer on the metal pattern exposed in the opening by a plating method; and forming a conducting layer on the barrier layer exposed in the opening.

14 Claims, 7 Drawing Sheets

(51) Int. Cl.
  *H01L 29/66*  (2006.01)
  *H01L 29/778* (2006.01)
  *H01L 29/20*  (2006.01)
  *H01L 29/40*   (2006.01)
  *H01L 21/285*  (2006.01)
  *H01L 29/423*  (2006.01)
  *H01L 29/812*  (2006.01)

(56) References Cited

U.S. PATENT DOCUMENTS

2008/0230786 A1* 9/2008 Heikman et al. ................ 257/76
2009/0146191 A1* 6/2009 Green et al. .................. 257/280
2012/0156843 A1* 6/2012 Green et al. .................. 438/261

FOREIGN PATENT DOCUMENTS

JP   2006-261252 A   9/2006
JP   2011-238805 A   11/2011

OTHER PUBLICATIONS

Office Action dated Jan. 26, 2016, issued in counterpart Japanese Patent Application No. 2012-147538, with English translation. (15 pages).

\* cited by examiner

FIG. 1  COMPARATIVE EXAMPLE
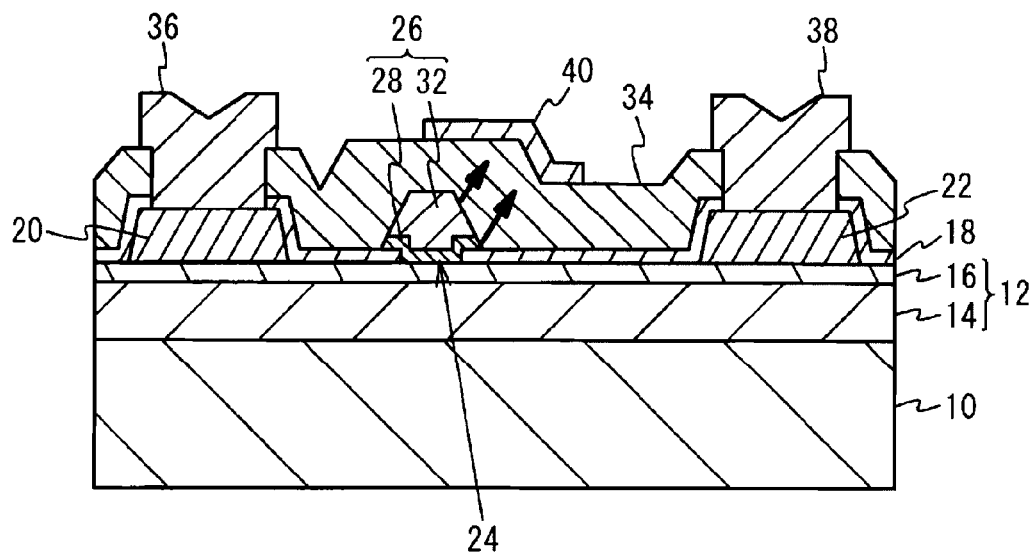
FIG. 2
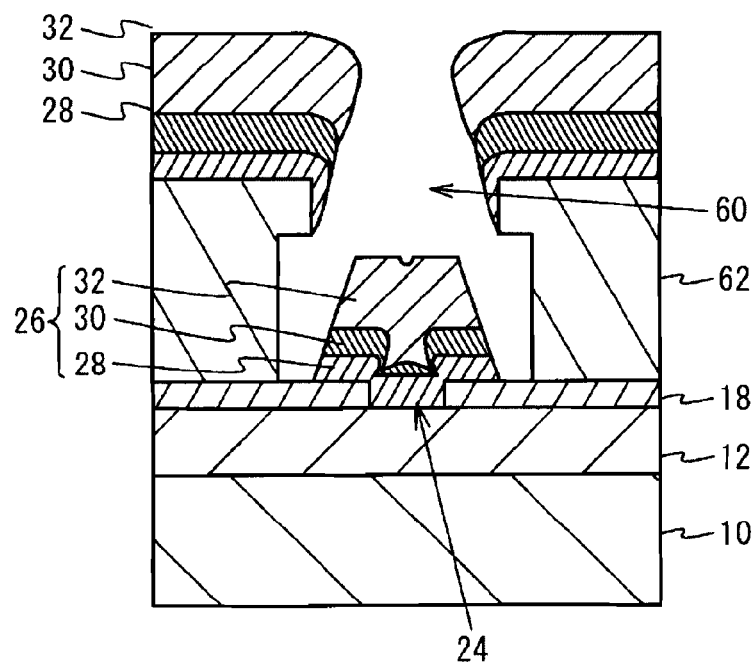

METHOD FOR FABRICATING SEMICONDUCTOR DEVICE AND SEMICONDUCTOR DEVICE

CROSS-REFERENCE TO RELATED APPLICATION

This application is based upon and claims the benefit of priority of the prior Japanese Patent Application No. 2012-147538, filed on Jun. 29, 2012, the entire contents of which are incorporated herein by reference.

BACKGROUND (i) Technical Field

The present invention relates to semiconductor devices and methods for fabricating semiconductor devices.

(ii) Related Art

Semiconductor devices using nitride semiconductors are used in, for example, power devices capable of operating at high frequencies and outputting high power. Particularly, FETs (Field Effect Transistors) such as HEMT (High Electron Mobility Transistor) are known as transistors suitable for amplifying in high-frequency or RF bands, which may include microwaves, quasi-millimeter waves, or millimeter waves.

The semiconductor devices using nitride semiconductors employ a protection film on a nitride semiconductor layer. It is known that the use of the silicon nitride film for protection is capable of reducing the collapse phenomenon of the drain current. It is known that the adhesion of the nitride semiconductor layer and the silicon nitride film is improved by adjusting the composition of the silicon nitride film (see Japanese Patent Application Publication No. 2006-261252, for example).

An exemplary FET using nitride semiconductors has a structure in which an insulating film covers a gate electrode having a metal pattern including Ni (nickel) provided on a nitride semiconductor layer. When voltages are applied to the FET for a regular operation, Ni contained in the metal pattern may diffuse into the insulating film, and the gate electrode may be short-circuited to another metal layer, which may cause the FET to fail.

SUMMARY

According to an aspect of the present invention, there is provided a method for fabricating a semiconductor device capable of suppressing diffusion of Ni included in a metal pattern.

According to another aspect of the present invention, there is provided a method for fabricating a semiconductor device including: forming a metal pattern including nickel on a semiconductor layer, the metal pattern having upper and side surfaces; forming a mask pattern having an opening in which upper and side surfaces of the metal pattern therein being exposed; forming a barrier layer on the metal pattern exposed in the opening by a plating method; and forming a conducting layer on the barrier layer exposed in the opening.

BRIEF DESCRIPTION OF THE DRAWINGS

FIG. 1 is a cross-sectional view of a semiconductor device in accordance with a first comparative example;

FIG. 2 is a cross-sectional view that illustrates a step of forming a gate electrode by vacuum deposition;

DETAILED DESCRIPTION

Figure 3:
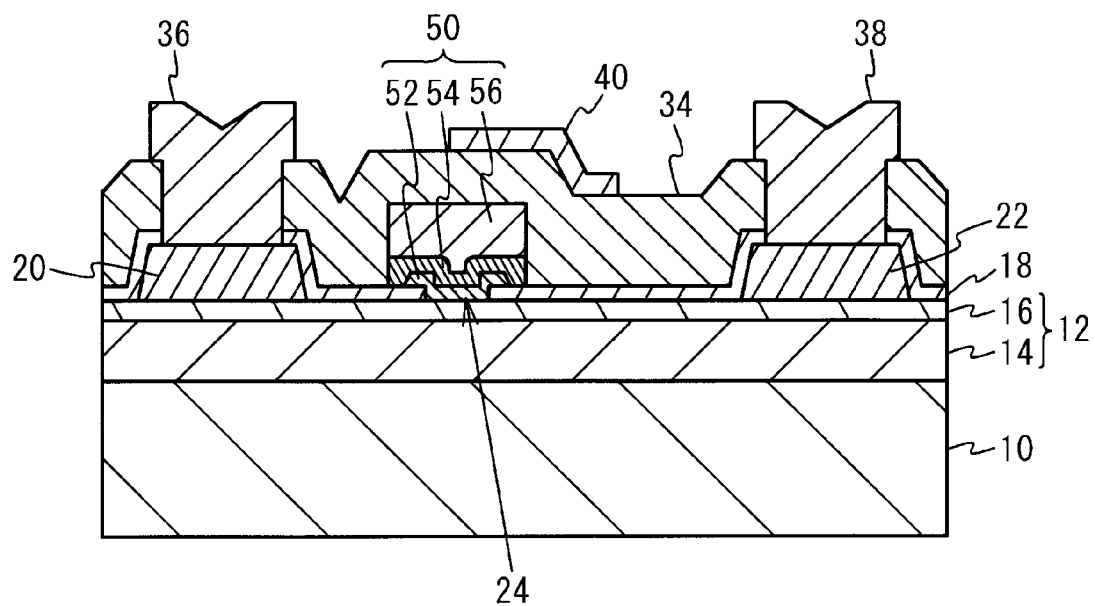
FIG. 3 is a cross-sectional view of a semiconductor device in accordance with a first embodiment.

Now, a description is given of a first comparative example that is a HEMT using nitride semiconductors. FIG. 1 is a cross-sectional view of a semiconductor device in accordance with the first comparative example. Referring to FIG. 1, a nitride semiconductor layer 12 is provided on a substrate 10, which is a SiC substrate. The nitride semiconductor layer 12 includes a channel layer 14 of a GaN (gallium nitride) layer and an electron supply layer 16 of an AlGaN (aluminum gallium nitride) layer, which layers are stacked in this order. A barrier layer of an AlN (aluminum nitride) layer may be provided between the substrate 10 and the channel layer 14. A cap layer of a GaN layer may be provided on the electron supply layer 16.

A source electrode 20 and a drain electrode 22 are provided on the nitride semiconductor layer 12. The source electrode 20 and the drain electrode 22 may be a metal layer composed of a Ti (titanium) layer and an Al layer stacked in this order from the nitride semiconductor layer 12, and have ohmic contacts with the nitride semiconductor layer 12.

A first insulating film 18, which is a silicon nitride film, is provided on the nitride semiconductor layer 12 so as to cover the source electrode 20 and the drain electrode 22. The thickness of the first insulating film 18 is 30 nm, for example. An opening 24 is formed in the first insulating film 18 between the source electrode 20 and the drain electrode 22. A gate electrode 26 is provide so as to be buried in the opening 24. The gate electrode 26 has an end portion located on the first insulating film 18, and has a T shape. The gate electrode 26 has a Schottky contact on the nitride semiconductor layer 12. The gate electrode 26 is a metal layer composed of a Ni layer 28 and a Au (gold) layer 32. The Ni layer 28 is provided on the first insulating film 18 and is buried in the opening 24. The Au layer 32 is provided on the Ni layer 28.

A second insulating film 34 of a silicon nitride film is provided on the first insulating film 18 so as to cover the gate electrode 26. The second insulating film 34 has steps that reflect a stepwise shape of the gate electrode 26. A source interconnection line 36 and a drain interconnection 38 are respectively provided on the source electrode 20 and the drain electrode 22 so as to pierce the second insulating film 34 and the first insulating film 18. The source interconnection line 36 is provided so as to contact the upper surface of the source electrode 20. The drain interconnection line 38 contacts the upper surface of the drain electrode 22. The source interconnection line 36 and the drain interconnection line 38 are a metal layer such as a Au plated layer.

A field plate 40 is provided on the second insulating film 34. The field plate 40 is connected to the source interconnection line 36 outside of an active region of the FET and is thus connected electrically to the source electrode 20. The field plate 40 is provided in a position between the gate electrode 26 and the drain electrode 22 so as to cover the step of the second insulating film 34 that reflects the step of the gate electrode 26. The field plate 40 runs along the gate electrode 26 and extends above the gate electrode 26. The field plate 40 is a metal layer such as a Au plated layer.

A burn-in test of the FET of the first comparative example is described below. In the burn-in test, the voltage applied to the gate electrode 26 is adjusted to obtain a predetermined drain-source current. The burn-in test identifies diffusion of Ni included in the Ni layer 28 of the gate electrode 26 into the second insulating film 34 in the FET that has been subjected to the burn-in test. The diffusion of Ni may take place from the surface of the Au layer 32 after Ni in the Ni layer 28 diffuses into the Au layer 32 and reaches the surface of the Au layer 32 in addition to the diffusion from the side surfaces of the Ni layer 28 that contacts the second insulating film 34 (see arrows in FIG. 1). The diffusion of Ni described above may be considered as diffusion that takes place in such a manner that ionized Ni oxide generated by reaction with oxygen such as moisture absorbed to the gate electrode 26 diffuses into the second insulating film 34 by the heat and the electric field applied in the burn-in test. The diffusion of Ni in the Ni layer 28 into the second insulating film 34 may cause the Ni-diffused region to reach the field plate 40 to thus short-circuit the gate electrode 26 and the field plate 40, and thus cause the FET to fail.

With the above in mind, the inventors consider a gate electrode structured to cover the Ni layer 28 with a palladium (Pd) layer in order to suppress the diffusion of Ni in the Ni layer 28 into the second insulating film 34. Since the gate electrode 26 is formed by vacuum deposition and liftoff, the inventors try to form the Pd layer by vacuum deposition.

FIG. 2 is a cross-sectional view that illustrates a step of forming a gate electrode by vapor deposition. Referring to FIG. 2, the first insulating film 18 having the opening 24 is formed on the nitride semiconductor layer 12 on the substrate 10. A resist layer 62 having an opening 60 larger than the opening 24 is formed on the first insulating film 18. Then, Ni is deposited by vacuum deposition with the resist layer 62 being used as a mask so as to be buried in the opening 24, so that the Ni layer 28 is formed on the first insulating film 18. Then, Pd is deposited by vacuum deposition to form a Pd layer 30 on the Ni layer 28. Subsequently, Au is deposited by vacuum deposition to form a Au layer 32 is formed on the Pd layer 30. The gate electrode 26 thus formed is composed of the Ni layer 28, the Pd layer 30 and the Au layer 32.

As illustrated in FIG. 2, the cross section of the gate electrode 26 has a trapezoidal shape having a width that gradually becomes smaller towards the top. This is because as the deposition proceeds, a deposited film formed on the resist layer 62 narrows the opening 60 of the resist layer 62. Therefore, even when Pd is deposited by vacuum deposition after the Ni layer 28 is formed, the Pd layer 30 is formed on only the upper surface of the Ni layer 28, and has a difficulty in covering the side surfaces of the Ni layer 28. Thus, in a case where the second insulating film 34 is formed so as to cover the gate electrode 26 having the above-described shape, Ni may diffuse into the second insulating film 34 from the side surfaces of the Ni layer 28.

A description is now given of embodiments in which the upper and side surfaces of the Ni layer included in the gate electrode is covered with a Pd layer for the purpose of preventing diffusion of Ni included in the Ni layer.

FIG. 3 is a cross-sectional view of a semiconductor device in accordance with a first embodiment. Referring to FIG. 3, a gate electrode 50 is composed of a metal pattern formed by a Ni layer 52, a barrier layer formed by a Pd layer 54, and an electrically conductive or conducting layer formed by a Au layer 56. The Ni layer 52 is formed on the first insulating film 18 so as to be buried in the opening 24. The Pd layer 54 covers the upper and side surfaces of the Ni layer 52. The Au layer 56 is provided on the Pd layer 54. The Ni layer 52 has a Schottky junction to the nitride semiconductor layer 12. The length of the Pd layer 54 in the gate length direction is equal to that of the Au layer 56 in the gate length direction. That is, the cross section of the gate electrode 50 is constant in the thickness direction. The thickness of the Ni layer 52 is 30 nm, for example. The thickness of the Pd layer 54 is 60 nm, for example. The Au layer 56 is 500 nm thick, for example. The Ni layer 52 is formed by vacuum deposition, and the Pd layer 54 and the Au layer 56 are formed by a non-electrolytic plating method, as will be described in detail later. The other structures of the first embodiment are similar to those of the first comparative example illustrated in FIG. 1, and a description thereof is therefore omitted here.

Figure 4A:
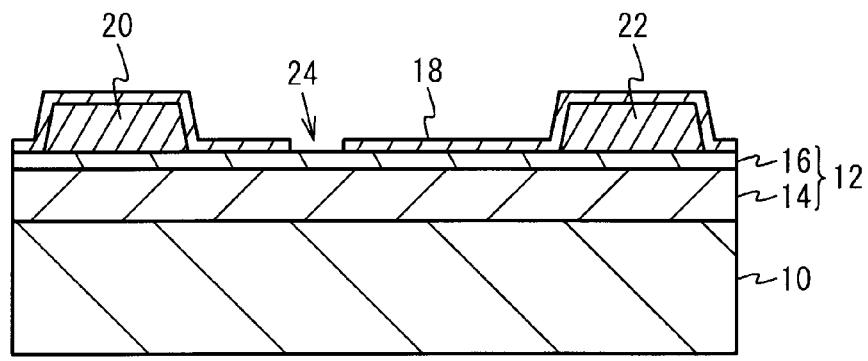
FIGS. 4A through 4C are cross-sectional views of steps of a method for fabricating a semiconductor device in accordance with the first embodiment.

A description is now given of a method for fabricating the semiconductor device in accordance with the first embodiment. FIGS. 4A through 4C and 5A through 5C are cross-sectional views that illustrate the fabrication method of the first embodiment. Referring to FIG. 4A, as the nitride semiconductor layer 12, the channel layer 14 of the GaN layer and the electron supply layer 16 of the AlGaN layer are grown on the substrate 10 of SiC in this order. The channel layer 14 and the electron supply layer 16 may be grown by MOCVD (Metal Organic Chemical Vapor Deposition). A metal layer is formed by vacuum deposition and liftoff. The metal layer is composed of the Ti layer and the Al layer stacked in this order from the nitride semiconductor layer 12. After that, the metal layer is annealed at a temperature of 500° C. to 800° C. to form the source electrode 20 and the drain electrode 22, which are ohmic electrodes that are in ohmic contact with the nitride semiconductor layer 12. The first insulating film 18 which is formed by the silicon nitride film is provided on the nitride semiconductor layer 12 by CVD so as to cover the source electrode 20 and the drain electrode 22. The opening 24 is formed by removing the first insulating film 18 in the region in which the gate electrode is to be formed between the source electrode 20 and the drain electrode 22. The surface of the nitride semiconductor layer 12 is exposed through the opening 24. Thus, the first insulating film 18 having the opening 24 is formed on the nitride semiconductor layer 12.

Figure 4B:
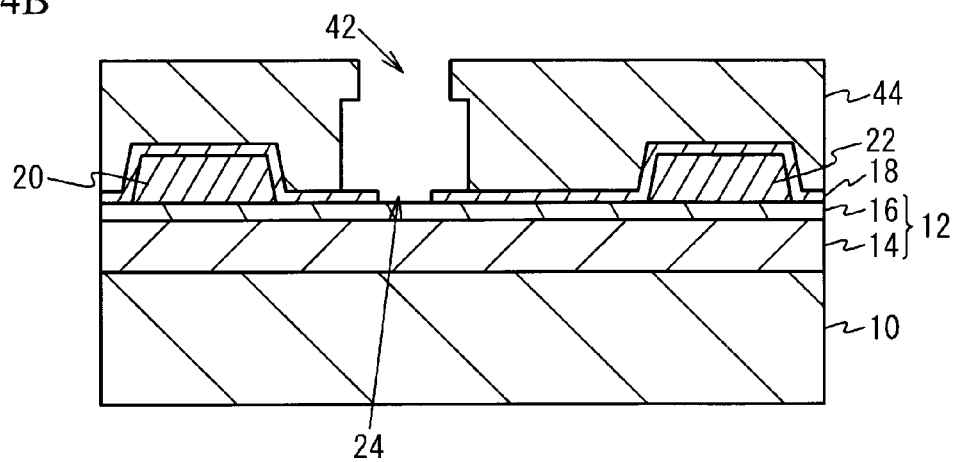

Referring to FIG. 4B, a first resist layer 44 is formed on the first insulating film 18. The first resist layer 44 is a mask layer and has a first opening 42, which is located in the position corresponding to that of the opening 24 and is larger than the opening 24. The first resist layer 44 has a shape such that the upper portion projects from the lower portion in the first opening 42. The first resist layer 44 formed into the above shape may be formed by repeating a photo process twice. The first resist layer 44 may have an inversely tapered shape in the first opening 42.

Figure 4C:
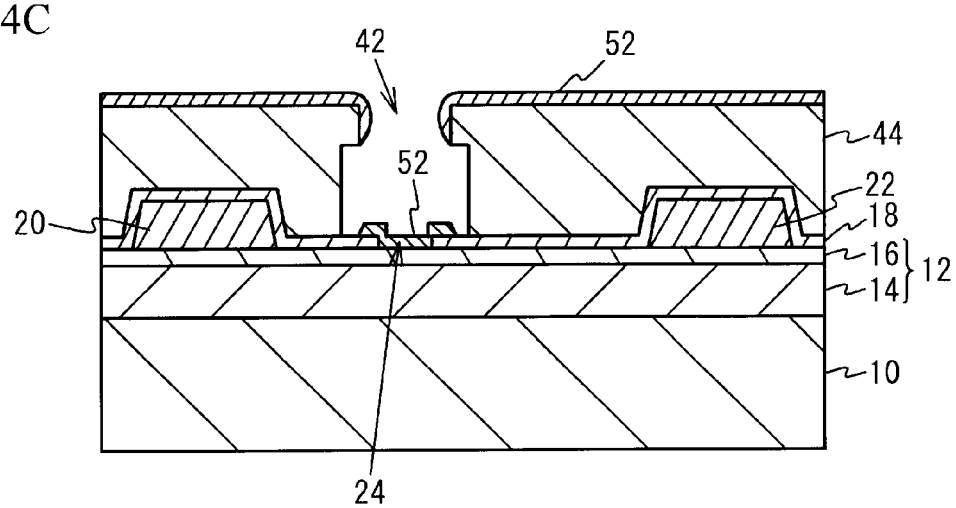

As illustrated in FIG. 4C, a metal pattern of Ni is formed by vacuum deposition with the first resist layer 44 being used as a mask. Thus, the metal pattern including Ni and having the upper and side surfaces is formed on the nitride semiconductor layer 12. That is, the Ni layer 52 is formed on the nitride semiconductor layer 12 in the opening 24 and the first insulating film 18. Typically, the Ni layer 52 has a cross section that is narrower towards the top because the Ni layer 52 is formed by vacuum deposition.

Figure 5A:
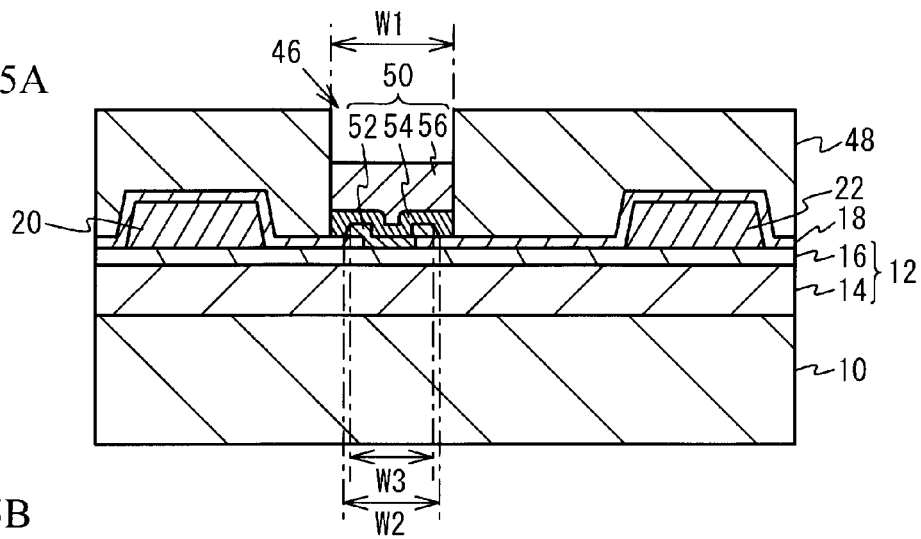
FIGS. 5A through 5C are cross-sectional views of steps that follow the steps of FIGS. 4A through 4C.

As illustrated in FIG. 5A, after the first resist layer 44 is removed, a second resist layer 48 is formed on the first insulating film 18. The second resist layer 48 is a mask layer in which a second opening 46 that is wider than the Ni layer 52 in the gate length direction is formed so as to correspond to the Ni layer 52. Next, the second opening 46 is filled with Pd by the non-electrolytic plating method with the second resist layer 48 being used as a mask. This Pd is a barrier layer for diffusion of Ni. In the non-electrolytic plating method, Pd grows isotropically with respect to the Ni layer 52, which is an underlying active layer. Thus, the Pd layer 54 is formed to cover the exposed surfaces of the Ni layer 52, that is, the upper and side surfaces of the Ni layer 52 (metal pattern). Thus, the surfaces of the Ni layer 52 are covered with the Pd layer 54. Since the first insulating film 18 is formed on the nitride semiconductor layer 12, the Pd layer 54 and the nitride semiconductor layer 12 are isolated from each other by the first insulating film 18. Thus, the Pd layer 54 is formed without contacting the nitride semiconductor layer 12. Then, the second opening 46 is filled with Au by the non-electrolytic plating method to grow the conductive layer 56 of Au on the Pd layer 54. Through the above steps, the gate electrode 50 composed of the Ni layer 52, the Pd layer 54 and the Au layer 56 is formed. The width W1 of the Pd layer 54 and the Au layer 56 is defined by the second opening 46 formed in the second resist layer 48, and is 1.0 µm, for example. The width W2 of a portion of the Ni layer 52 that contacts the upper surface of the first insulating film 18 is 0.8 µm, for example. The width W3 of the upper portion of the Ni layer 52 is 0.6 µm, for example.

Figure 5B:
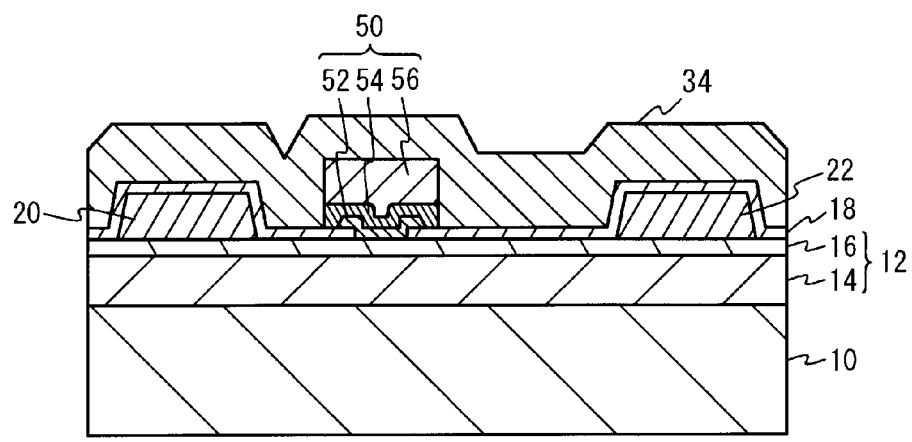

Referring to FIG. 5B, the second resist layer 48 is removed, and the second insulating film 34 of a silicon nitride film is then formed by plasma CVD so as to cover the gate electrode 50. The second insulating film 34 has steps shaped so as to reflect the steps of the gate electrode 50.

Figure 5C:
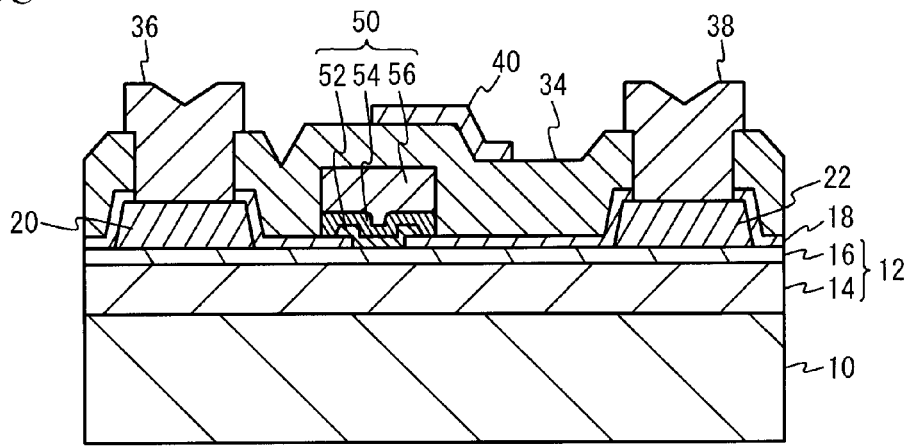

Referring to FIG. 5C, openings are formed by removing the second insulating film 34 and the first insulating film 18 above the source electrode 20 and the drain electrode 22. A metal layer is formed in the openings and on the second insulating film 34 by plating. The metal layer includes the source interconnection line 36 that contacts the upper surface of the source electrode 20, the drain interconnection line 38 that contacts the upper surface of the drain electrode 22, and the field plate 40 provided so as to cover the steps of the second insulating films 34. Through the above steps, the semiconductor device of the first embodiment illustrated in FIG. 5C is complete.

According to the first embodiment, the gate electrode 50 is provided on the first insulating film 18 so as to be buried in the opening 24, and has the Ni layer 52 having the upper and side surfaces, the Pd layer 54 that covers the upper and side surfaces of the Ni layer 52, and the Au layer 56 provided on the Pd layer 54. The Pd layer 54 makes it possible to provide the Ni layer 52 without contacting the second insulating film 34 and the Au layer 56. Thus, the Pd layer 54 functions as a barrier layer that suppresses diffusion of Ni included in the Ni layer 52, and prevents Ni in the Ni layer 52 from diffusing into the second insulating film 34. It is therefore possible to suppress the failure of the semiconductor device.

The Pd layer 54 that covers the upper and side surfaces of the Ni layer 52 is formed by the non-electrolytic plating method, as has been described in FIG. 5A. In the non-electrolytic plating method, the plated layer grows isotropically with respect to the underlying active layer. Thus, the Pd layer 54 covers the exposed surfaces of the Ni layer 52 including the top and side surfaces thereof. The isotropic growing of the Pd layer 54 makes it possible to cover the steps in the upper surface of the Ni layer 52 formed due to the steps of the opening 24 with a sufficient thickness. For example, in the case where the Pd layer 30 is formed by vacuum deposition as has been described with reference to FIG. 2, the deposition source and the substrate 10 are positionally defined so that the deposition particles from the deposition source are vertically incident to the substrate 10. It is therefore difficult to cover the steps in the upper surface of the Ni layer 28 with a sufficient thickness of the Pd layer 30. Therefore, Ni in the Ni layer 28 diffuses into the Au layer 32, and further diffuses into the second insulating film 34. In contrast, since the first embodiment forms the Pd layer 54 by the non-electrolytic plating method, the steps in the upper surface of the Ni layer 52 can be covered with a sufficient thickness of the Pd layer 54. It is therefore possible to prevent Ni in the Ni layer 52 from diffusing into the second insulating film 34 through the Au layer 56.

Figure 6A:
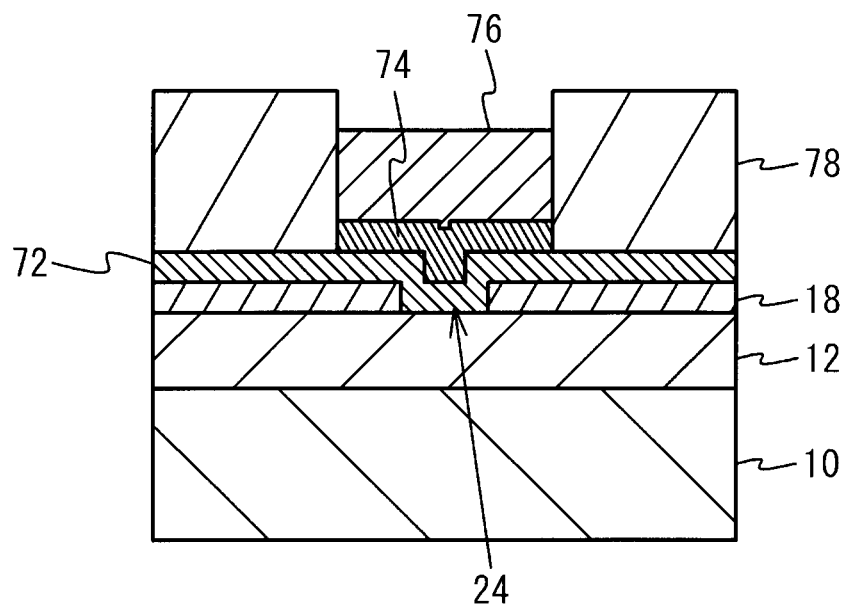
FIGS. 6A and 6B are cross-sectional views that illustrate a step of forming a Pd layer and a Au layer by electrolytic plating.
Figure 6B:
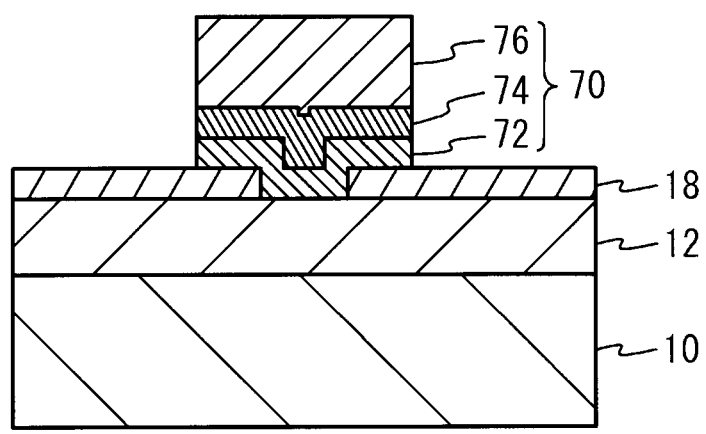

A description is now given of a problem caused when the Pd layer and the Au layer are formed by the electrolytic plating method. FIGS. 6A and 6B are cross-sectional views that illustrate a process of forming the Pd layer and the Au layer by the electrolytic plating method. Referring to FIG. 6A, a Ni layer 72 is formed by vacuum deposition or sputtering so as to be buried in the opening 24 of the first insulating film 18 on the nitride semiconductor layer 12. The Ni layer 72 remains on the entire surface of the substrate 10 in order to use the Ni layer 72 as a seed layer used for the Pd layer and the Au layer by electrolytic plating.

A resist layer 78 having an opening larger than the opening 24 is formed on the Ni layer 72. A Pd layer 74 and a Au layer 76 are grown on the Ni layer 72 in this order by electrolytic plating with the resist layer 78 being used as a mask.

As illustrated in FIG. 6B, the resist layer 78 is removed, and the Ni layer 72 is etched with the Au layer 76 and the Pd layer 74 being used as a mask. With this process, the gate electrode 70 having the Ni layer 72, the Pd layer 74 and the Au layer 76 is formed.

As described above, when the Pd layer 74 and the Au layer 76 are formed by the electrolytic plating method, the Ni layer 72 is used as the seed layer, and is therefore removed by etching after the Pd layer 74 and the Au layer 76 are formed. Thus, the side surfaces of the Ni layer 72 are not covered with the Pd layer 74, and Ni in the Ni layer 72 may diffuse into the second insulating film 34. The use of the electrolytic plating method for forming the Pd layer 74 and the Au layer 76 is not capable of preventing diffusion of Ni in the Ni layer 72. Therefore, the first embodiment employs the non-electrolytic plating method to form the Pd layer 54 and the Au layer 56.

The Au layer is provided for the purpose of reducing the resistance of the gate electrode. As illustrated in FIG. 2, when the gate electrode 26 is formed by vacuum deposition, the gate electrode 26 has the cross-section that becomes narrower towards the upper side. Thus, even when the Au layer 32 is thickened, only a small reduction in the resistance of the gate electrode 26 is available. In contrast, the first embodiment employs the non-electrolytic plating method to form the Pd layer 54 and the Au layer 56, and the gate electrode 50 has a rectangular shape. Therefore, as the Au layer 56 is made thicker, the resistance of the gate electrode 50 becomes smaller effectively.

When the Pd layer 30 and the Au layer 32 are formed by vacuum deposition as illustrated in FIG. 2, a positional error in patterning may take place in an outer peripheral portion on the substrate 10 that is a wafer. This is because the wafer is much larger than the deposition source. In contrast, the first embodiment employs the non-electrolytic plating method to form the Pd layer 54 and the Au layer 56. It is therefore possible to suppress positional errors of the Pd layer 54 and the Au layer 56 with respect to the Ni layer 52.

The thickness of the Ni layer 52 is not limited to 30 nm but may be not smaller than 10 nm and not larger than 100 nm. The thickness of the Pd layer 54 is not limited to 60 nm but may be not smaller than 10 nm and not larger than 80 nm. The thickness of the Au layer 56 is not limited to 500 nm but may be not smaller than 200 nm and not larger than 1000 nm. The thickness of the first insulating film 18 is not limited to 30 nm but may be not smaller than 10 nm and not larger than 100 nm. However, the ratio of the thickness of the first insulating film 18 to that of the Ni layer 52 is preferably larger than or equal to 0.5 and smaller than or equal to 1.5. If the above ratio is larger than 1.5 or more, the Ni layer 52 deposited on the first insulating film 18 may be physically separate from the Ni layer 52 buried in the opening 24. Therefore, the ratio is preferably smaller than or equal to 1.5. When the ratio is larger than or equal to 0.5, step portions formed on the upper surface of the Ni layer 52 due to the steps of the opening 24 are concerned in vacuum deposition. In contrast, since the first embodiment employs the non-electrolytic plating method to form the Pd layer 54, the step portions on the upper surface of the Ni layer 52 are covered with the Pd layer 54 having a sufficient thickness. It is thus possible to prevent Ni in the Ni layer 52 from diffusing into the second insulating film 34 through the Au layer 56. As a result, no problem arises even when the ratio is set larger than or equal to 0.5.

The thickness of the Pd layer 54 on the side surfaces of the Ni layer 52 (W1-W2 in FIG. 5A) is preferably larger than or equal to 0.2 μm and is more preferably larger than or equal to 0.3 μm, and is much more preferably larger than or equal to 0.4 μm for the purpose of preventing diffusion of Ni.

Figure 7A:
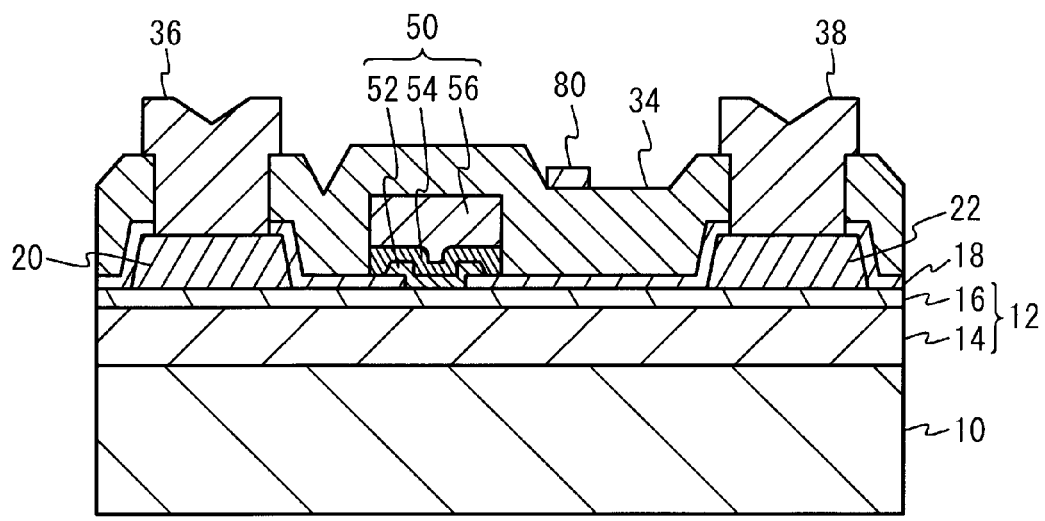
FIG. 7A is a cross-sectional view of a semiconductor device in accordance with a first variation of the first embodiment.

As illustrated in FIG. 3, the field plate 40 is provided in the position where the field plate 40 covers the step of the second insulating film 34 shaped due to the step of the gate electrode 50. Further, the field plate 40 extends along the gate electrode 50 and extends above the gate electrode 50. FIG. 7A illustrates a first variation of the above arrangement in the first embodiment. An FET illustrated in FIG. 7A has an arrangement in which a field plate 80 is located between the gate electrode 50 and the drain electrode 22 and does not extend above the gate electrode 50. The field plate 80 may be formed by a metal layer such as a Au plated layer like the field plate 40, and is connected to the source interconnection line 36 outside of the active region of the FET.

The field plates 40 and 80 formed on the second insulating film 34 are not limited to the case where these field plates are electrically connected to the source electrode 20 but may be electrically isolated from the source electrode 20. The field plates 40 and 80 may be floating conductors. Even in this case, Ni included in the Ni layer 52 of the gate electrode 50 is likely to diffuse into the second insulating film 34 towards the field plates 40 and 80. Therefore, it is advantageous to provide the Pd layer 54 that covers the top and side surfaces of the Ni layer 52. However, in the case where the field plates 40 and 80 are electrically connected to the source electrode 20, Ni included in the Ni layer 52 of the gate electrode 50 is more likely to diffuse into the second insulating film 34 towards the field plates 40 and 80. Thus, in this case, the use of the Pd layer 54 provided on the top and side surfaces of the Ni layer 52 is more effective in preventing diffusion of Ni.

Figure 7B:
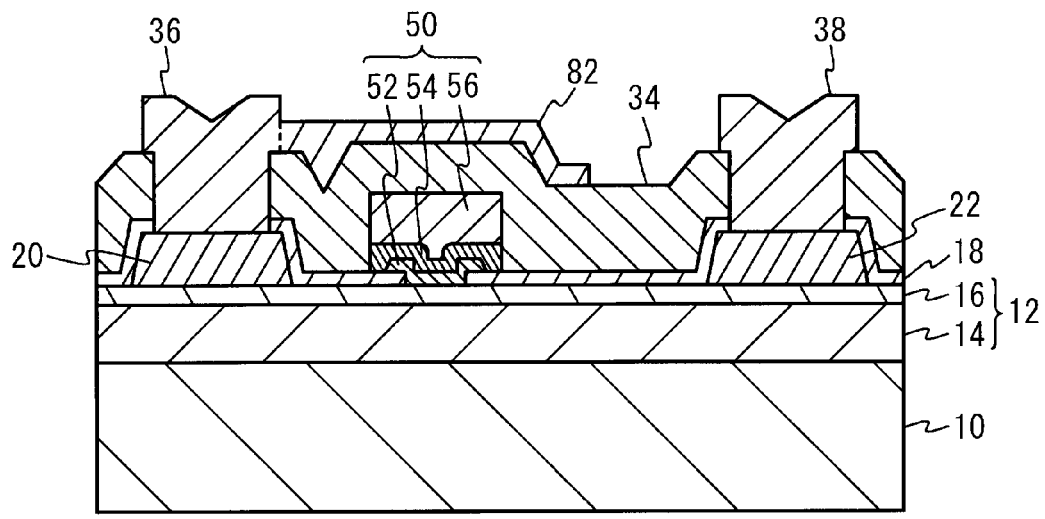
FIG. 7B is a cross-sectional view of a semiconductor device in accordance with a second variation of the first embodiment.

Instead of the field plate 40, a source wall 82 may be provided in FIG. 7B, which illustrates an FET in accordance with a second variation of the first embodiment. The source wall 82 is formed by a metal layer such as a Au plated layer and is connected to the source interconnection line 36. The source wall 82 extends from the source interconnection line 36 so as to cover the gate electrode 50 on the second insulating film 34, and extends to the position where the source wall 82 covers the step of the second insulating film 34. Since the source wall 82 is electrically connected to the source electrode 20, Ni included in the Ni layer 52 of the gate electrode 50 is likely to diffuse into the second insulating film 34 towards the source wall 82. Thus, when the source wall 82 is used, it is more effective in providing the Pd layer 54 on the top and side surfaces of the Ni layer 52.

Figure 8:
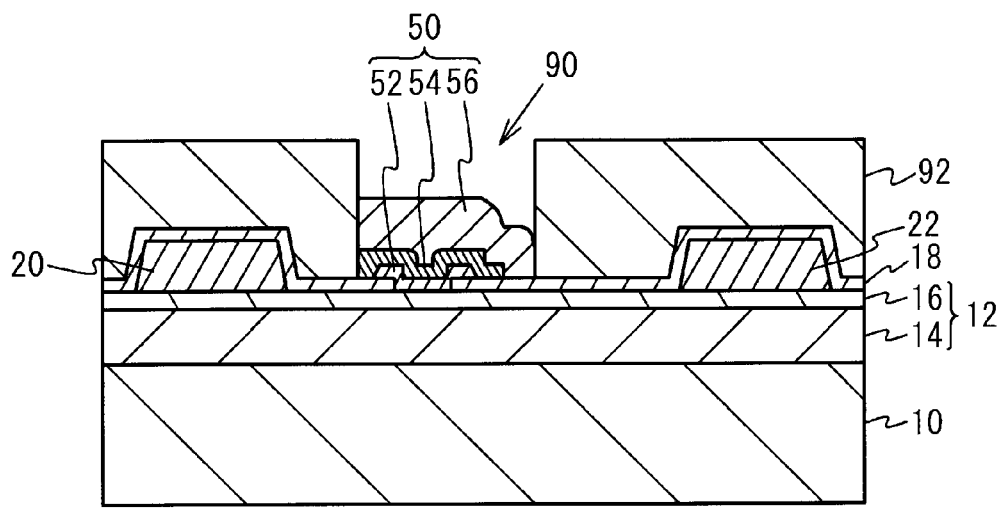
FIG. 8 is a cross-sectional view that illustrates a first variation of the step of forming a gate electrode.

As illustrated in FIG. 5A, the Pd layer 54 and the Au layer 56 are formed by the non-electrolytic plating method with the second resist layer 48 having the second opening 46 having the symmetrical shape on the source electrode 20 side and the drain electrode 22 side with respect to the Ni layer 52. However, the present invention is not limited to the above arrangement. FIG. 8 is a cross-sectional view of a first variation of the step of forming the gate electrode 50. Referring to FIG. 8, the Pd layer 54 and the Au layer 56 are formed by non-electrolytic plating with a second resist layer 92 being used a mask. The second resist layer has a second opening 90 having an asymmetrical shape on the source electrode 20 side and the drain electrode 22 side with respect to the Ni layer 52. In this case, the gate electrode 50 further extending towards the drain electrode 22 side is capable of reducing carrier traps close to the Schottky junction and reducing the collapse phenomenon of the drain current.

Figure 9:
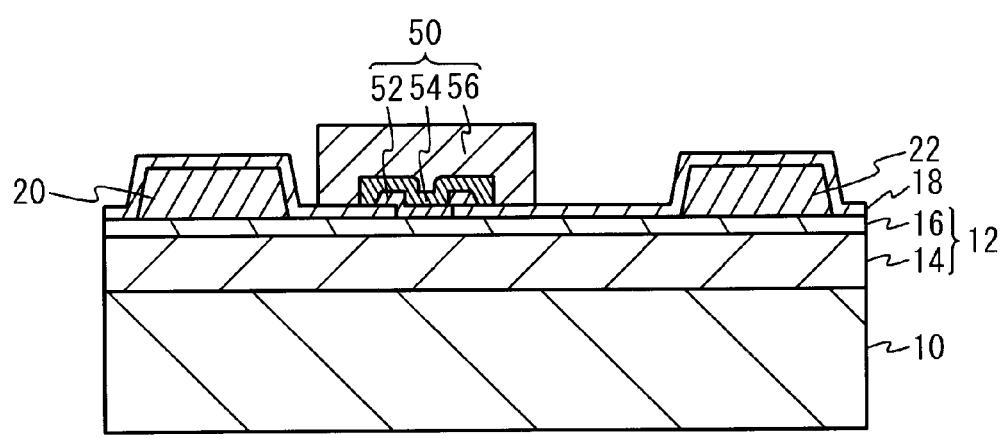
FIG. 9 is a cross-sectional view that illustrates a second variation of the step of forming the gate electrode.

As illustrated in FIG. 5A, the removal of the first resist layer 44 is followed by the step of forming the second resist layer 48 having the second opening 46 that is wider than the Ni layer 52. The second resist layer 48 is used as a mask for forming the Pd layer 54 and the Au layer 56 by the non-electrolytic plating method. However, the present invention is not limited to the above process. FIG. 9 is a cross-sectional view of a second variation of the step of forming the gate electrode 50. As illustrated in FIG. 9, in a case where there is not any limitation on the pattern sizes of the Pd layer 54 and the Au layer 56 but there is a sufficient room in the arrangement, the Pd layer 54 and the Au layer 56 may be formed by the non-electrolytic plating method without forming the second resist layer 48. The second variation omits the step of forming the second resist layer 48 and has a smaller number of the fabrication steps.

The Ni layer 52 may be formed by sputtering instead of vacuum deposition. After Ni is deposited to a few nm by vacuum deposition or sputtering, Ni, Pd and Au are successively grown by the non-electrolytic plating method. The above process using sputtering forms the gate electrode 50 composed of the Ni layer 52, the Pd layer 54 and the Au layer 56.

In the case where the first insulating film 18 having the opening 24 is provided on the nitride semiconductor layer 12, when the process for activating the FET is appropriately carried out, the metal can be grown on only the nitride semiconductor layer 12 in the opening 24 by the non-electrolytic plating method. Thus, all of the Ni layer 52, the Pd layer 54 and the Au layer 56 may be formed by the non-electrolytic plating method by appropriately carrying out the activation process.

As illustrated in FIG. 3, the Ni layer 52 is provided on the first insulating film 18 so as to be buried in the opening 24. The present invention is not limited to the Ni layer 52, but a metal pattern including Ni may be used. An exemplary metal pattern including Ni is a Ni layer, a layer including Ni and another metal, and a multilayered structure having a Ni layer and another metal layer.

The present invention is not limited to the arrangement in which the metal layer that covers the upper and side surfaces of the Ni layer 52 includes the Pd layer 54 that covers the upper and side surfaces of the Ni layer 52, and the Au layer 56 provided on the Pd layer 54. The upper and side surfaces of the Ni layer 52 may be covered with a barrier layer 54 other than the Pd layer 54, which may be a Pt (platinum) layer capable of preventing diffusion of Ni included in the Ni layer 52. The Au layer 56 on the Pd layer 54 may be replaced with another electrically conductive layer having a low resistance, which may be a Cu (copper) layer capable of realizing a low resistance of the gate electrode 50.

The substrate 10 is not limited to the SiC substrate but may be another substrate such as a Si substrate, a sapphire substrate or a GaN substrate. The nitride semiconductor layer formed on the substrate 10 may be a single layer or a stacked layer that includes at least one of a GaN layer, an InN layer, an AlN layer, an InGaN layer, an AlGaN layer, an InAlN layer and an InAlGaN layer. The first insulating film 18 and the second insulating film 34 may be an insulating film other than the silicon nitride film, which may be a silicon oxide film, for example.

The present invention is not limited to HEMT in the first embodiment but may include another type of FET such as MESFET (Metal Semiconductor Field Effect Transistor), and a semiconductor device other than FET. The metal layer on the second insulating film 34, which layer functions as the field plate or the source wall on the second insulating film 34, may be omitted. Even in this case, Ni in the Ni layer 52 may diffuse into the second insulating film 34. Therefore, it is desirable to cover the top and side surfaces of the Ni layer 52 with the Pd layer 54.

The present invention is not limited to the specifically described embodiments, but may include other embodiments and variations without departing from the scope of the claimed invention.

What is claimed is:

1. A method for fabricating a semiconductor device comprising:
    forming source and drain electrodes on a nitride semiconductor layer;
    forming a first insulating film having an opening on a nitride semiconductor layer,
    the opening of the first insulating film being located between the source electrode and the drain electrode,
    forming a metal pattern including nickel on the nitride semiconductor layer so that the metal pattern is formed in contact with the first insulating film and the nitride semiconductor layer exposed in the opening of the first insulating film, the metal pattern having an upper surface and side surfaces and being a lower layer of a gate electrode;
    forming a mask pattern having an opening in which the upper surface and all of the side surfaces of the metal pattern herein being exposed;
    forming a barrier layer being a metal layer and a middle layer of the gate electrode directly on the upper surface and the side surfaces of the metal pattern exposed in the opening of the mask pattern by a non-electrolytic plating method, the barrier layer covering the upper surface and all of the side surfaces of the metal pattern and being in contact with the upper surface and all of the side surfaces of the metal pattern, and the barrier layer formed on the side surfaces of the metal pattern and the nitride semiconductor layer being separated from each other by the first insulating film;
    forming a conducting layer on the barrier layer exposed in the opening of the mask pattern, the conducting layer being in contact with the barrier layer and an upper layer of the gate electrode; and
    forming a second insulating film on the conducting layer so that the second insulating film covers the conducting layer and is in contact with the conducting layer.

2. The method according to claim 1, further comprising forming a metal layer on the second insulating film.

3. The method according to claim 1, wherein a ratio of thickness of the first insulating film to the metal pattern is 0.5 to 1.5.

4. The method according to claim 1, wherein the metal pattern is formed by a vacuum evaporation method or a sputtering method.

5. The method according to claim 1, wherein the barrier layer includes Pd or Pt.

6. The method according to claim 1, wherein the conducting layer includes Au or Cu.

7. The method according to claim 1, wherein the first insulating film is composed of silicon nitride or silicon oxide.

8. The method according to claim 1, wherein the conducting layer extends toward the drain electrode beyond the gate electrode.

9. The method according to claim 1, wherein the second insulating film is composed of silicon nitride or silicon oxide.

10. The method according to claim 1, wherein the metal pattern is formed so that portions of the side surfaces of the metal pattern directly overlie the first insulating film.

11. The method according to claim 1, wherein the conducting layer extends toward the drain electrode beyond the barrier layer.

12. The method according to claim 1, wherein the metal pattern includes a Ni layer, the barrier layer includes a Pd layer or a Pt layer, and the conducting layer includes an Au layer or a Cu layer.

13. The method according to claim 1, wherein the barrier layer and the conducting layer are formed by using the mask pattern as a mask.

14. The method according to claim 13, wherein the conducting layer is formed by a non-electrolytic plating method.

* * * * *